US012574026B2

(12) United States Patent
Wakazono et al.

(10) Patent No.: US 12,574,026 B2
(45) Date of Patent: Mar. 10, 2026

(54) DRIVE DEVICE

(71) Applicants:AutoNetworks Technologies, Ltd.,
Yokkaichi (JP); **Sumitomo Wiring
Systems, Ltd.**, Yokkaichi (JP);
Sumitomo Electric Industries, Ltd.,
Osaka (JP)

(72) Inventors: Keisuke Wakazono, Yokkaichi (JP);
Yuuki Sugisawa, Yokkaichi (JP)

(73) Assignees: AutoNetworks Technologies, Ltd.,
Yokkaichi (JP); **Sumitomo Wiring
Systems, Ltd.**, Yokkaichi (JP);
Sumitomo Electric Industries, Ltd.,
Osaka (JP)

( * ) Notice: Subject to any disclaimer, the term of this
patent is extended or adjusted under 35
U.S.C. 154(b) by 260 days.

(21) Appl. No.: 18/245,103

(22) PCT Filed: Aug. 3, 2021

(86) PCT No.: PCT/JP2021/028721
§ 371 (c)(1),
(2) Date: Mar. 13, 2023

(87) PCT Pub. No.: WO2022/059370
PCT Pub. Date: Mar. 24, 2022

(65) Prior Publication Data
US 2023/0370057 A1 Nov. 16, 2023

(30) Foreign Application Priority Data
Sep. 16, 2020 (JP) .................................. 2020-155303

(51) Int. Cl.
*H03K 17/082* (2006.01)

(52) U.S. Cl.
CPC ................................ *H03K 17/0822* (2013.01)

(58) Field of Classification Search
CPC .................................................. H03K 17/0822
See application file for complete search history.

(56) References Cited

U.S. PATENT DOCUMENTS 4,916,572 A * 4/1990 Guajardo ............. H03K 17/785
361/91.4
5,091,664 A 2/1992 Furuhata
(Continued)

FOREIGN PATENT DOCUMENTS

JP 2014-232948 A 12/2014

OTHER PUBLICATIONS

International Search Report, Application No. PCT/JP2021/028721,
mailed Nov. 2, 2021. ISA/Japan Patent Office.

*Primary Examiner* — Danny Nguyen
*Assistant Examiner* — Samantha L Faubert
(74) *Attorney, Agent, or Firm* — Honigman LLP

(57) ABSTRACT

A drive device is a drive device for driving a first switching
element. The drive device includes a protection switch. The
protection switch is provided between a first terminal and a
third terminal of the first switching element, turned off when
a voltage of the third terminal is a second threshold or more,
and turned on when the voltage of the third terminal is less
than the second threshold. A potential difference between the
first terminal and the third terminal is less than a first
threshold when the protection switch is on.

2 Claims, 5 Drawing Sheets

(56)                    References Cited

U.S. PATENT DOCUMENTS

| | | | |
|---|---|---|---|
| 6,232,674 B1 * | 5/2001 | Frey | B60L 3/00 |
| | | | 307/10.1 |
| 6,538,279 B1 | 3/2003 | Blanchard | |
| 6,804,096 B2 * | 10/2004 | Nagata | H03K 17/063 |
| | | | 361/91.2 |
| 9,136,833 B2 * | 9/2015 | Hayasaka | H03K 17/08 |
| 9,912,329 B2 * | 3/2018 | Fukami | H03K 17/08104 |
| 2018/0013415 A1 * | 1/2018 | Ikeda | H03K 17/102 |

* cited by examiner

DRIVE DEVICE

CROSS-REFERENCE TO RELATED APPLICATIONS

This application is the U.S. national stage of PCT/JP2021/028721 filed on Aug. 3, 2021, which claims priority of Japanese Patent Application No. JP 2020-155303 filed on Sep. 16, 2020, the contents of which are incorporated herein.

TECHNICAL FIELD

The present disclosure relates to a drive device.

BACKGROUND

JP 2014-232948A discloses an example of a drive element protection circuit. In the drive element protection circuit disclosed in JP 2014-232948A, when the power supply voltage decreases to a low voltage protection value or less, the drive circuit outputs a low duty ratio signal for a predetermined monitoring period. With this operation, the drive element protection circuit prevents an excessive current from flowing through a drive transistor even if a short circuit abnormality occurs in a motor 10.

FIG. 5 illustrates a circuit that is turned on if the potential difference between a first terminal (a gate terminal in the example shown in FIG. 5) and a third terminal (a source terminal in the example shown in FIG. 5) of a switching element 104 is a threshold or more, and is turned off if the potential difference is less than the threshold. In such a circuit, if the switching element 104 is switched on in a state where a short circuit has occurred on a conductive path on the third terminal side (the source terminal side in the example shown in FIG. 5), an excessive current may flow through the switching element 104 immediately after switching on the switching element 104. In order to protect the circuit from such an overcurrent, as shown in FIG. 5, a countermeasure is conceivable in which a detection circuit for detecting the voltage and current in a conductive path in which the switching element 104 is provided, and if the detection circuit detects an abnormality in voltage (e.g. a low voltage state where the voltage decreases to the threshold voltage or less) or an overcurrent, a control unit 108 turns off the switching element 104. However, with such a countermeasure, the operation of turning off the switching element 104 after detecting the current and voltage is essential.

An object of the present disclosure is to provide a technique for realizing a drive device that can protect a switching element if a ground fault occurs in a conductive path on which the switching element is provided, with a simpler configuration.

SUMMARY

A drive device that is an aspect of the present disclosure is a drive device for driving a switching element that includes a first terminal, a second terminal, and a third terminal, in a circuit that includes the switching element, and in which the switching element is turned on when a potential difference between the first terminal and the third terminal is a first threshold or more, and the switching element is turned off when the potential difference is less than the first threshold, the drive device including: a protection switch, in which the protection switch is provided between the first terminal and the third terminal, turned off when a voltage of the third terminal is a second threshold or more, and turned on when the voltage of the third terminal is less than the second threshold, and the potential difference between the first terminal and the third terminal is less than the first threshold when the protection switch is on.

Advantageous Effects of Invention

A technique according to the present disclosure realizes a drive device that quickly switches off the switching element if a voltage on one side of a conductive path in which the switching element is provided decreases significantly, with a simpler configuration.

DETAILED DESCRIPTION OF PREFERRED EMBODIMENTS

Figure 1:
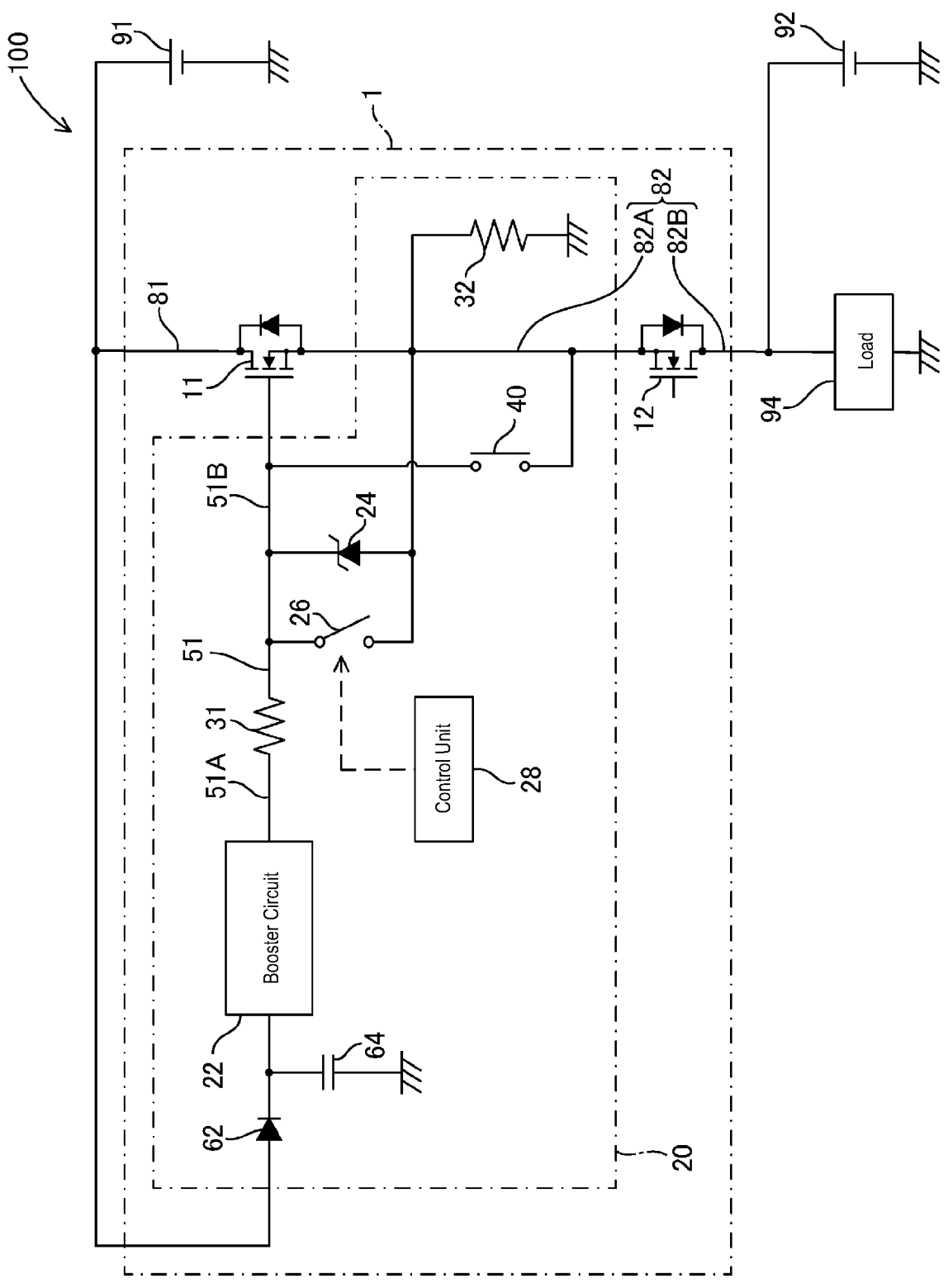
FIG. 1 is a circuit diagram schematically illustrating an in-vehicle system provided with a drive device according to a first embodiment.

Hereinafter, embodiments of the present disclosure will be listed and illustrated. Note that the features of the first to the sixth aspects illustrated herein may be combined in any manner as long as no contradictions arise.

First Aspect

In a first aspect, a drive device for driving a switching element that includes a first terminal, a second terminal, and a third terminal, in a circuit that includes the switching element, and in which the switching element is turned on when a potential difference between the first terminal and the third terminal is a first threshold or more, and the switching element is turned off when the potential difference is less than the first threshold, the drive device including: a protection switch, in which the protection switch is provided between the first terminal and the third terminal, turned off when a voltage of the third terminal is a second threshold or more, and turned on when the voltage of the third terminal is less than the second threshold, and the potential difference between the first terminal and the third terminal is less than the first threshold when the protection switch is on.

The drive device of the above-described first aspect has a function of protecting a circuit that can turn on the switching element by inputting a voltage signal with which the potential difference between the first terminal and the third terminal is the first threshold or more. If an abnormality occurs such as the voltage on the conductive path on the third terminal side decreasing to a level that is lower than the second threshold, this drive device can forcibly and immediately turn on the protection switch, and forcibly and immediately turn off the switching element. Accordingly, this drive device can realize a configuration that can immediately switch off the switching element with a simpler configuration if a voltage on one side of a conductive path on which the switching element is provided decreases significantly.

Second Aspect

In a second aspect, drive device according to the above-described first aspect may further include the following future. This drive device according to the second aspect includes a signal output unit that outputs a high level signal at a predetermined voltage and a signal line provided between the signal output unit and the first terminal. The drive device according to the second aspect further includes a first resistor part provided on the signal line, a second resistor part that is different from the first resistor part, an element part provided between the first resistor part and the second resistor part. One end of the element part is electrically connected, on the signal line, between the first resistor part and the first terminal. Another end of the element part is electrically connected to the third terminal. One end of the second resistor part is electrically connected to the third terminal. Another end of the second resistor is electrically connected to a reference conductive path. On the condition that the signal output unit outputs a high level signal, a current flows from the signal output unit via the first resistor part and the second resistor part to the reference conductive path, the third terminal has a voltage that is the second threshold or more, and a potential difference between the first terminal and the third terminal due to a decrease in voltage that occurs in the element part.

In the drive device of the above-described second aspect, on the condition that a high level signal is output from the signal output unit, a current flows from the signal output unit to the reference conductive path via the above first resistor part, the element part, and the second resistor part. Then, due to a decrease in voltage of the element part, the potential difference between the first terminal and the third terminal becomes the first threshold or more. In this configuration, if a high level signal is output from the signal output unit and a current appropriately flows through the element part, the switching element can be appropriately turned on. Further, if a high level signal is output from the signal output unit, as long as a current flows through the second resistor part to a certain extent, the voltage of the third terminal can be increased with respect to the reference conductive path and stably set to a voltage that is higher or equal to the second threshold. With performing these operations as basic operations, the drive device can forcibly turn on the protection switch if an abnormality such as the voltage of the conductive path connected to the third terminal decreasing to be less than the second threshold.

Third Aspect

In a third aspect, the drive device according to the above-described second aspect may include the following features. The drive device according to the third aspect includes a switch unit that switches a state between the first terminal and the third terminal between a short-circuit state and a cancelled state where the short-circuit state is cancelled. The switching element turns off when the switching element switches to the short-circuit state in a state where the signal output unit outputs a high level signal. The switching element turns on, on the condition that when the switching element keeps the cancelled state in a state where the signal output unit outputs a high level signal.

The drive device according to the above-described third aspect, in a state where the signal output unit is outputting a high level signal, the switching element can be turned on or off by the switch unit.

Fourth Aspect

In a fourth aspect, the drive device according to any one of the above-described first to third aspect may include the following features. The switching element is provided between a first conductive path and a second conductive path. The second terminal is electrically connected to the first conductive path. The third terminal is electrically connected to the second conductive path. A first power supply unit is provided on the first conductive path side. A second power supply unit is provided on the second conductive path side. A current flows between the first power supply unit and the second power supply unit on the condition that at least the switching element is on. A state where a voltage of the third terminal is the second threshold or more when there is conduction between the first power supply unit and the second power supply unit is a normal state. A state where a voltage of the third terminal is less than the second threshold when there is conduction between the first power supply unit and the second power supply unit is an abnormal state.

The drive device according to the above-described fourth aspect can be applied to a circuit in which the switching element is interposed between the first power supply unit and the second power supply unit. In the normal state, the protection switch can be kept off when the first power supply unit and the second power supply unit are in electrical continuity, and in the abnormal state, the protection switch can be kept on when the first power supply unit and the second power supply unit are in electrical continuity. In other words, this drive device makes it possible to keep the protection switch off when the appropriate voltage based on the output from the power supply unit is applied to the third terminal, and prevent the switching element from performing a forcible off operation based on the protection switch. On the other hand, if the appropriate voltage based on the output from the power supply unit is not applied to the third terminal due to a ground fault or the like, this drive device can keep the protection switch on, and turn off the switching element forcibly and stably.

Fifth Aspect

In a fifth aspect, the drive device according to the above-described fourth aspect may include the following features. The drive device according to the fifth aspect includes a second switching element that is connected to the switching element in series between the first power supply unit and the second power supply unit. The second conductive path includes one conductive path connected between the third terminal and the second switching element on one side of the second switching element, and another conductive path connected to the other side of the second switching element. One end of the protection switching is electrically connected to the first terminal, and another end of the protection switch is electrically connected to the one conductive path. A current is allowed to flow between the first power supply unit and the second power supply unit on the condition that both the switching element and the second switching element are on. A current flow is shut off when both the switching element and the second switching element are off. When both the switching element and the second switching element are on and in the normal state, the voltage of the third terminal is the second threshold or more. When both the switching element and the second switching element are on and in the abnormal state, the voltage of the third terminal is less than the second threshold.

The drive device of the above-described fifth aspect can be applied to a circuit that switches the state between the first power supply unit and the second power supply unit between a conductive state and a shut-off state, by switching on/off the switching element and the second switching element. In this circuit, if both the switching element and the second switching element are on and in the normal state, the state between the first power supply unit and the second power supply unit enters the conductive state and the voltage of the third terminal becomes the second threshold or more. In other words, if the two switching elements are on and the normal state, it is possible to prevent the switching elements from performing the forcible off operation based on the protection switch while keeping the state between the two power supply units in the conductive state. On the other hand, if the two switching elements are on and enter the abnormal state, the protection switch can be immediately turned on. Accordingly, even if the two power supply units are in the conductive state until just before the switching elements enter the abnormal state, the switching elements can be immediately switched to the forcible off state.

Sixth Aspect

In a sixth aspect, the drive device according to any one of the above-described second to fifth aspects, may include the following features. The element part is a zener diode, the anode of the Zener diode is electrically connected to the third terminal, and the cathode of the Zener diode is electrically connected to the first terminal. When the high level signal is output from the signal output unit, the Zener diode yields when a high level signal is output from the signal output unit, and the potential difference between the first terminal and the third terminal is kept at the first threshold or more.

In the drive device according to the above-described sixth aspect, when no operation of forcibly short-circuiting the first terminal and the third terminal is performed and the high level signal is output from the signal output unit, a current flows from the signal output unit to the reference conductive path via the first resistor part, the zener diode, and the second resistor part. Then, due to a decrease in voltage that occurs in the zener diode, the potential difference between the first terminal and the third terminal is kept at the first threshold or more and the switching elements can be stably kept on. Also, in the normal state, due to the current flowing to the reference conductive path via the second resistor part, the third terminal is kept at the voltage higher than that of the reference conductive path, and making it possible to stably keep the voltage of the third terminal at the second threshold or more.

First Embodiment

1. Overview of In-Vehicle System

The following description relates to an in-vehicle system 100 that is an example of a system to which a drive device according to a first embodiment is applied. The in-vehicle system 100 shown in FIG. 1 is configured as an in-vehicle power supply system provided with a plurality of power supplies (a first power supply unit 91 and a second power supply unit 92).

The in-vehicle system 100 shown in FIG. 1 is a system including the first power supply unit 91, the second power supply unit 92, a load 94, a first conductive path 81, a second conductive path 82, and a relay device 1.

The load 94 may be any electrical component as long as it can receive power supply via the second conductive path 82. Various in-vehicle electrical components such as an actuator or are motor may be adopted as the load 94.

The first power supply unit 91 is configured as a first power storage unit for outputting a first output voltage (e.g. 12 V). The second power supply unit 92 is configured as a second power storage unit for outputting a second output voltage (e.g. 12 V). The first output voltage and the second output voltage may be the same or different from each other, as appropriate. The first power supply unit 91 and the second power supply unit 92 are constituted by a known power supply unit such as a battery such as a lead battery or a lithium ion battery, or a capacitor such as an electrical double layer capacitor. The first power supply unit 91 and the second power supply unit 92 may be constituted by the same kind of power storage units or different kinds of power storage units.

The first conductive path 81 is a conductive path electrically connected to a high-potential terminal of the first power supply unit 91. The first conductive path 81 is connected between a drain terminal of the switching element 11 and the first power supply unit 91. The first output voltage is applied to the first conductive path 81 based on the power supplied from the first power supply unit 91.

The second conductive path 82 is a conductive path electrically connected to a high-potential terminal of the second power supply unit 92. The second output voltage is applied to the second conductive path 82 based on the power supplied from the second power supply unit 92. The second conductive path 82 includes a conductive path 82A and a conductive path 82B. The conductive path 82A corresponds to an example of one conductive path. The conductive path 82A is connected between a source terminal (a third terminal) of the first switching element 11 and a source terminal of the second switching element 12, on one side of the second switching element 12. The conductive path 82B corresponds to an example of another conductive path. The conductive path 82B is connected between a drain terminal of the second switching element 12 and the second power supply unit 92 on the other side of the second switching element 12.

The relay device 1 includes the first switching element 11, the second switching element 12, and the drive device 20. The relay device 1 is a device for switching the state between the first power supply unit 91 and the second power supply unit 92 between the conductive state and the shut-off (non-conductive) state.

The first switching element 11 corresponds to an example of a switching element. The first switching element 11 may function as a first FET. The first switching element 11 is configured as a first MOSFET (Metal Oxide Semiconductor Field Effect Transistor). In the example shown in FIG. 1, the first switching element 11 is constituted as an N-channel MOSFET that includes a gate terminal, a drain terminal, and a source terminal. The gate terminal of the first switching element 11 corresponds to an example of a first terminal. The drain terminal of the first switching element 11 corresponds to an example of a second terminal. The source terminal of the first switching element 11 corresponds to an example of a third terminal. The first switching element 11 is turned on when the potential difference between the gate terminal and the drain terminal is the first threshold or more, and turned off when the potential difference between the gate terminal and the drain terminal is less than the first threshold. Note that, the first switching element 11 is also simply referred to as a switching element 11.

The first switching element 11 is provided between the first conductive path 81 and the second conductive path 82.

A signal line 51B constituting a signal line 51 (described later) is electrically connected to the gate terminal of the first switching element 11. The drain terminal of the first switching element 11 is electrically connected to the first conductive path 81. A voltage depending on the output voltage of the first power supply unit 91 is applied to the drain terminal of the first switching element 11. The conductive path 82A constituting a part of the second conductive path 82 is electrically connected to the source terminal of the first switching element 11. One end of the element part 24 (zener diode) and one end of the second resistor part 32 are electrically connected to the source terminal of the first switching element 11. The anode of a body diode of the first switching element 11, is electrically connected to the source terminal and the conductive path 82A, and its cathode is electrically connected to the drain terminal and the first conductive path 81. In this manner, the first power supply unit 91 is provided on the first conductive path 81 side of the first switching element 11, and the second power supply unit 92 is provided on the second conductive path 82 side thereof. In this configuration, on the condition that the first switching element 11 is on, a current flows from the first power supply unit 91 side toward the second power supply unit 92, and if the first switching element 11 is off, no current flows from the first power supply unit 91 side toward the second power supply unit 92.

The second switching element 12 may function as a second FET. The second switching element 12 is constituted as a second MOSFET. In the example shown in FIG. 1, the second switching element 12 is constituted as an N-channel MOSFET including a gate terminal, a drain terminal, and a source terminal. An on signal and an off signal that are transmitted from the drive circuit are input to the gate terminal of the second switching element 12. The drive circuit may be constituted by a part or all of the control unit 28, or may be constituted by a circuit different from the control unit 28. The second switching element 12 is turned on when an on signal (a predetermined high-level voltage signal) is supplied from the drive circuit to its gate terminal, and turned off when an off signal (e.g. a predetermined low-level voltage signal) is supplied to its gate terminal.

The second switching element 12 is connected to the first switching element 11 in series between the first conductive path 81 and the second conductive path 82. A conductive path 82B constituting a part of the second conductive path 82 is electrically connected to the drain terminal of the second switching element 12. A voltage depending on the output voltage of the second power supply unit 92 is applied to the drain terminal of the second switching element 12. In addition to the source terminal of the first switching element 11, one end of the element part 24 and one end of the second resistor part 32 are electrically connected to the source terminal of the second switching element 12. The anode of the body diode of the second switching element 12 is electrically connected to the source terminal and the conductive path 82A, and its cathode is electrically connected to the drain terminal and the conductive path 82B.

In this manner, the body diode of the first switching element 11 and the body diode of the second switching element 12 are arranged in opposite orientations. In this configuration, a current flows from the second power supply unit 92 side toward the first power supply unit 91 on the condition that the second switching element 12 is on, and if the second switching element 12 is off, no current flows from the second power supply unit 92 side toward the first power supply unit 91. More specifically, the relay device 1 allows a current to flow bidirectionally between the first power supply unit 91 and the second power supply unit 92 on the condition that both the first switching element 11 and the second switching element 12 are on. If both the first switching element 11 and the second switching element 12 are off, the relay device 1 shuts off the bidirectional current flow between the first power supply unit 91 and the second power supply unit 92.

2. Details of the Drive Device

The drive device 20 is a drive device for driving the first switching element 11. The drive device 20 mainly includes a signal line 51, a first resistor part 31, a second resistor part 32, an element part 24, a switch 26, a protection switch 40, a booster circuit 22, and the like.

The booster circuit 22 corresponds to an example of a signal output unit. The booster circuit 22 boosts the input voltage based on the power that is input from the first power supply unit 91 via the diode 62, and outputs a high level signal having a predetermined voltage that is higher than the input voltage (e.g. a signal having a voltage of 24 V). The high level signal that is output from the booster circuit 22 is higher than the output voltages of the first power supply unit 91 and the output voltage of the second power supply unit 92. Various known circuits may be adopted as the booster circuit 22 as long as it is a circuit that can boost the input voltage to generate an output voltage that is higher than the input voltage. Note that a capacitor 64 is connected between the input line arranged between the cathode of the diode 62 and the booster circuit 22, and the ground.

The signal line 51 is provided between the booster circuit 22 and the gate terminal of the switching element 11. A conductive path of the signal line 51 that is connected between the first resistor part 31 and the booster circuit 22 is a signal line 51A. Of the signal line 51, a conductive path connected between the first resistor part 31 and the gate terminal of the switching element 11 is a signal line 51B.

The first resistor part 31 is arranged on the signal line 51. One end of the first resistor part 31 is electrically connected to the booster circuit 22. The other end of the first resistor part 31 is electrically connected to one end of the switch 26, one end of the element part 24, one end of the protection switch 40, and the gate terminal of the switching element 11.

The element part 24 is an element provided between the first resistor part 31 and the second resistor part 32. One end of the element part 24 is electrically connected between the first resistor part 31 of the signal line 51 and the gate terminal of the switching element 11. The other end of the element part 24 is electrically connected to the source terminal of the switching element 11. In the example shown in FIG. 1, the element part 24 is a zener diode. The anode of this zener diode is electrically connected to the source terminal of the switching element 11, and the cathode of the zener diode is electrically connected to the gate terminal of the switching element 11. The zener diode constituting the element part 24 yields when a voltage that is higher than the voltage of the conductive path 82A by a given value or more is applied to the signal line 51B, and keeps the potential difference between the signal line 51B and the conductive path 82A at a constant voltage.

The second resistor part 32 is a resistor that is different from the first resistor part 31. One end of the second resistor part 32 is electrically connected to the source terminal of the switching element 11. The other end of the second resistor part 32 is electrically connected to a reference conductive path. The reference conductive path is a conductive path that is kept at a constant low voltage, and is the ground in the example shown in FIG. 1. In the configuration shown in FIG. 1, the first resistor part 31, the element part 24, and the second resistor part 32 are connected in series between the booster circuit 22 and the ground.

The switch 26 is provided between the signal line 51B and the conductive path 82A. The switch 26 switches the state between the signal line 51B and the conductive path 82A between a conductive state (specifically, a state where a short-circuit is performed) or a state where the current flow (conduction) via the switch 26 is cancelled (specifically, a state where the short-circuit is cancelled). The switch 26 may be constituted by a semiconductor switch or a mechanical relay.

The control unit 28 is a control device that switches and outputs an on signal for turning on the switch 26 and an off signal for turning off the switch 26. The control unit 28 functions as a drive circuit for driving the switch 26. The control unit 28 may be constituted by an information processing apparatus such as a microcomputer, or may be constituted by another hardware circuit.

When an on signal is supplied from the control unit 28, the switch 26 turns on and short-circuits the signal line 51B and the conductive path 82A. When an off signal is supplied from the control unit 28, the switch 26 turns off and cancels the short circuit between the signal line 51B and the conductive path 82A. When the switch 26 is on, a current is allowed to flow from the signal line 51B to the conductive path 82A via the switch 26, and when the switch 26 is off, no current flows via the switch 26. The control unit 28 and the switch 26 correspond to an example of a switch unit, and switch the state between the gate terminal and the source terminal of the switching element 11 between a short-circuit state, and a cancelled state where the short-circuit state is cancelled. By switching on the switch 26, the control unit 28 and the switch 26 short-circuit the gate terminal and the source terminal of the switching element 11 to be the same potential, and set the potential difference between the gate terminal and the source terminal to less than the first threshold. On the other hand, by switching off the switch 26, the control unit 28 and the switch 26 cancel the short-circuit state.

The protection switch 40 is provided between the gate terminal and the source terminal of the switching element 11. The protection switch 40 turns off when the voltage (voltage based on the ground) of the source terminal of the switching element 11 is the second threshold or more, and turns on when the voltage is less than the second threshold. One end of the protection switch 40 is electrically connected to the gate terminal of the switching element 11. The other end of the protection switch 40 is electrically connected to the conductive path 82A (one conductive path). The protection switch 40 is disposed such that the potential difference between the gate terminal and the source terminal of the switching element 11 is less than the first threshold when the protection switch 40 is on.

Various configurations can be adopted as the protection switch 40 as long as it includes the above functions. In the representative example described as follows, the protection switch 40 and the circuitry around it are configured as shown in FIG. 2.

Figure 2:
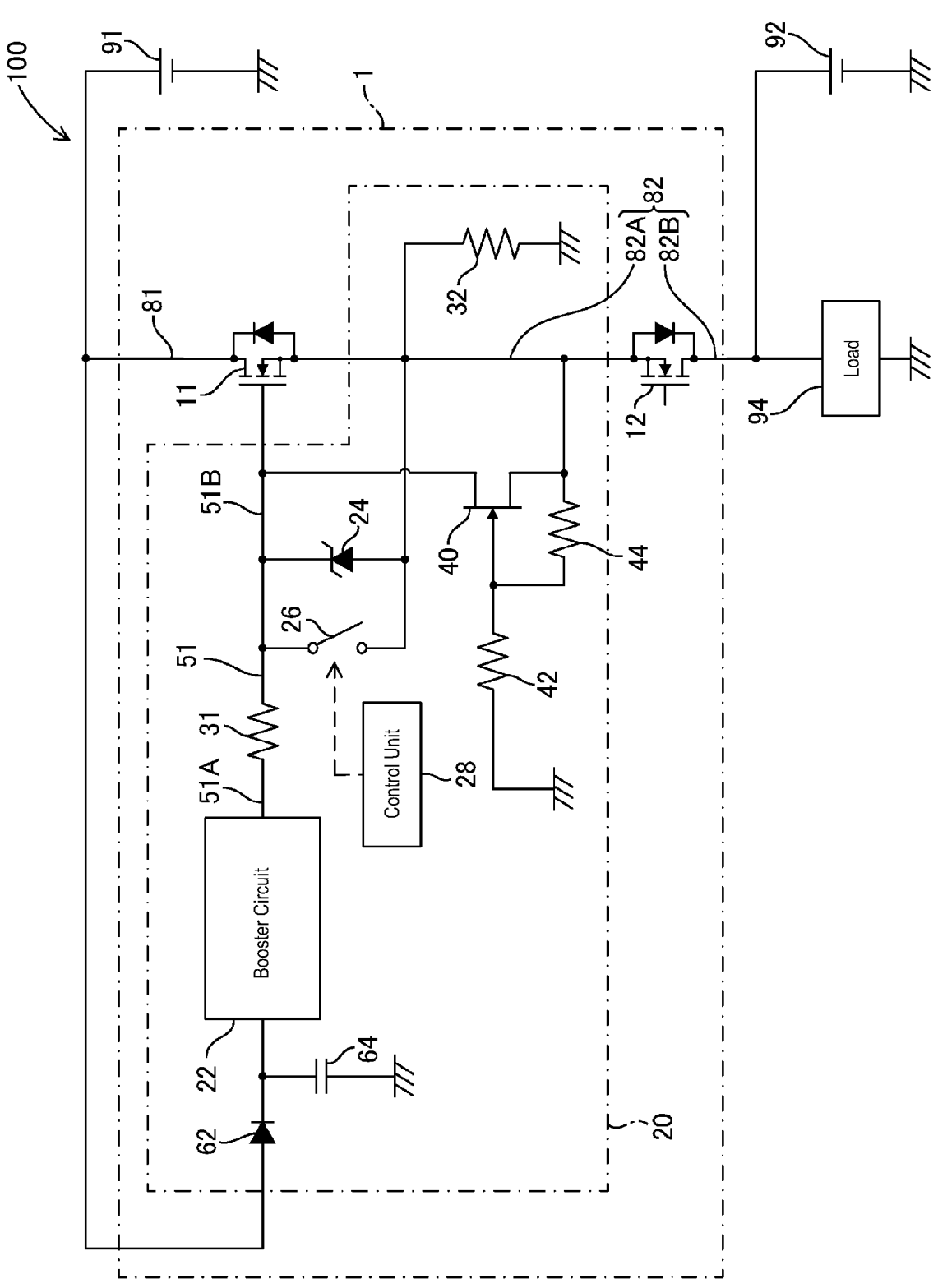
FIG. 2 is a circuit diagram illustrating an example in which the drive device is embodied in the in-vehicle system in FIG. 1.

In the drive device 20 shown in FIG. 2, the protection switch 40 is configured as a so-called normally-closed type semiconductor switch. Specifically, the protection switch 40 may be constituted by a depression MOSFET, a junction FET, or the like. In the example of FIG. 2, the resistors 42 and 44 are connected in series between the conductive path 82A and the ground, and a voltage obtained by dividing the voltage between the conductive path 82A and the ground by the division ratio of the resistors 42 and 44 is input to the gate of the protection switch 40. In this configuration, the higher the voltage of the conductive path 82A, the higher the voltage that is input to the gate of the protection switch 40. When the voltage of the conductive path 82A with respect to the ground is the second threshold or more, the protection switch 40 is kept off, and when the voltage of the conductive path 82A with respect to the ground is less than the second threshold, the protection switch 40 is kept on.

3. Operations of Drive Device

First, the operations in the normal state in which no ground fault occurs in the conductive path 82B, the load 94, and the like will be described. Note that, in the present specification, the voltage of the source terminal of the switching element 11 is the second threshold or more when there is conduction between the first power supply unit 91 and the second power supply unit 92. In other words, when both the first switching element 11 and the second switching element 12 are on and in the normal state, the voltage of the source terminal of the switching element 11 is the second threshold or more. A state where the voltage of the source terminal of the switching element 11 is less than the second threshold when there is conduction between the first power supply unit 91 and the second power supply unit 92 is an abnormal state. In other words, when both the first switching element 11 and the second switching element 12 are on and there is an abnormal state, the voltage of the source terminal of the switching element 11 is less than the second threshold.

Figure 3:
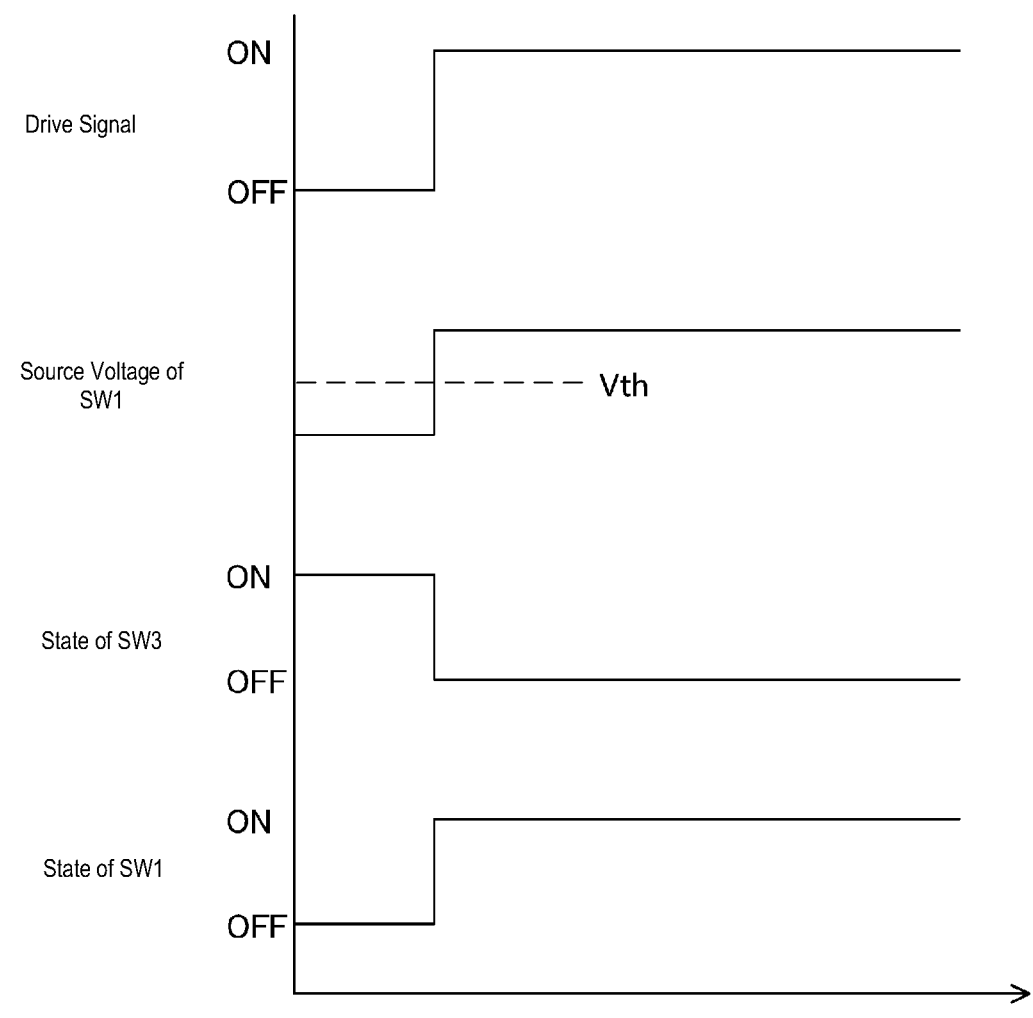
FIG. 3 is a timing chart showing a relationship between a drive signal, a source voltage of a switching element (SW1), a state of a protection switch (SW3), and a state of a switching element (SW1) when the in-vehicle system in FIG. 2 is in a normal state.
Figure 4:
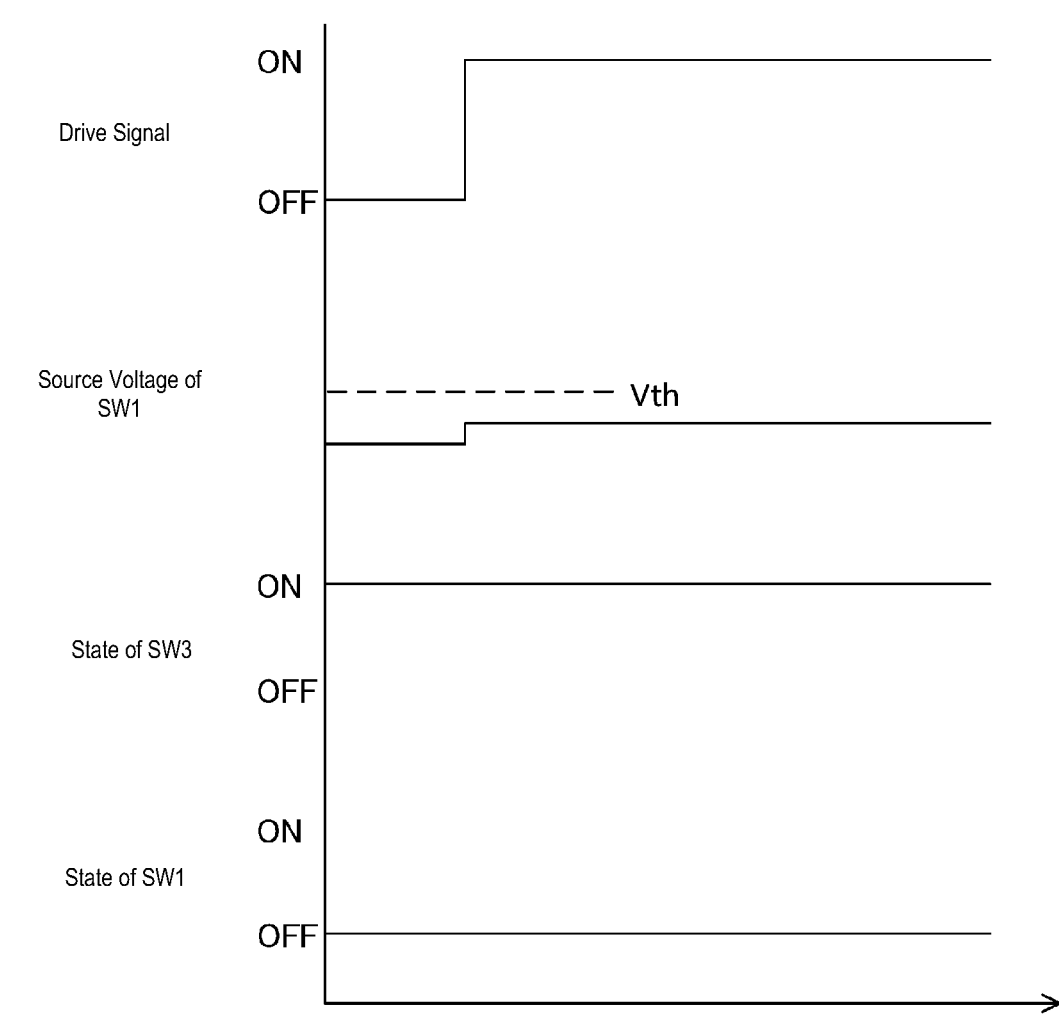
FIG. 4 is a timing chart showing a relationship between the drive signal, a source voltage of a switching element (SW1), the state of a protection switch (SW3), and the state of a switching element (SW1) when the in-vehicle system in FIG. 2 is in an abnormal state.
Figure 5:
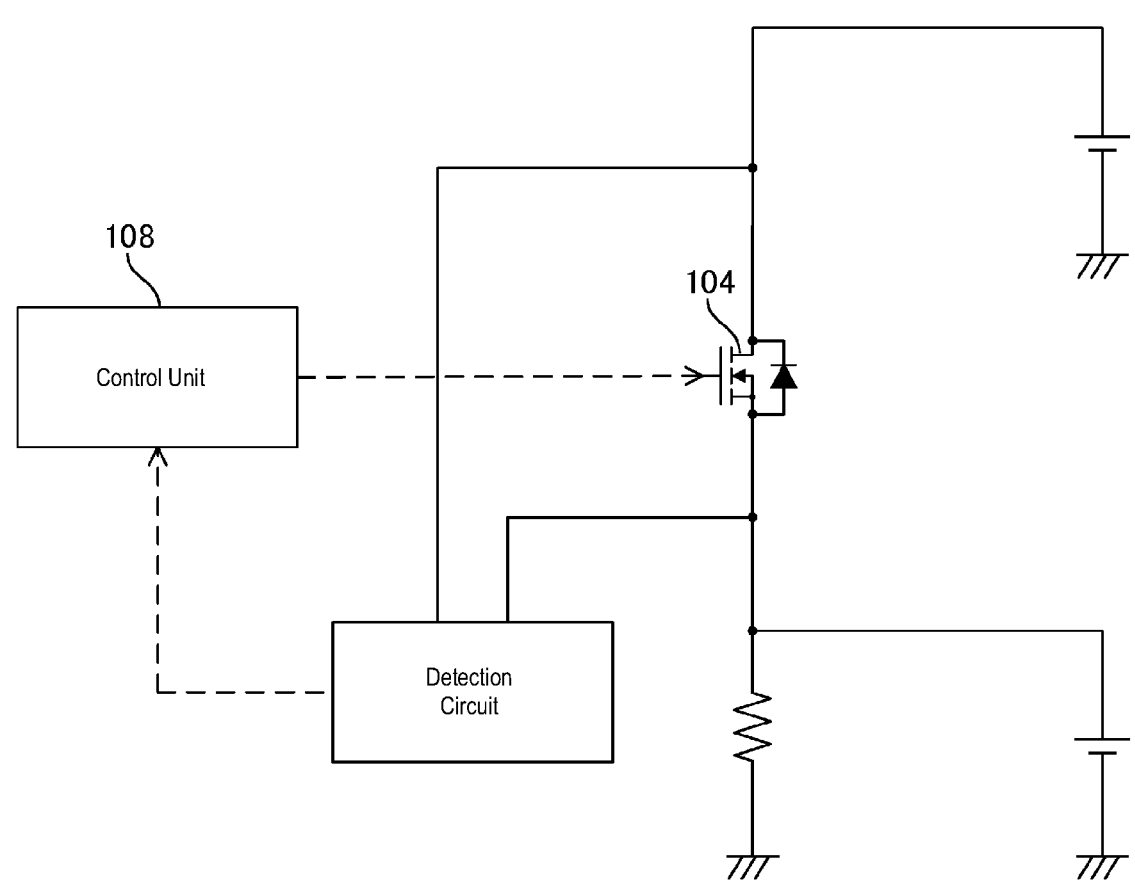
FIG. 5 is a circuit diagram schematically illustrating an in-vehicle system provided with a drive device in to a comparative example.

FIG. 3 shows a relationship between the drive signal, the source voltage of the switching element (SW1), the state of the protection switch (SW3), and the state of the switching element (SW1), in the normal state. In FIGS. 3 and 4, the state where the drive signal is on is the state where the switch 26 is off, and the state where the drive signal is off is the state where the switch 26 is on. In the drive device 20 shown in FIG. 2, when turning on the first switching element 11, the control unit 28 outputs an off signal (on signal in terms of the drive signal) to the switch 26. When turning off the first switching element 11, the control unit 28 outputs an off signal (on signal in terms of the drive signal) to the switch 26. As shown in FIG. 3, when the control unit 28 outputs an on signal (off signal in terms of the drive signal) to the switch 26, in other words, when the control unit 28 switches the circuit to the short-circuit state (when the switch 26 is on), the first switching element 11 is turned off. At this time, if the second switching element 12 is off, the voltage of the source terminal of the first switching element 11 is kept to less than the second threshold Vth, and the protection switch 40 (SW3) is kept on.

When the control unit 28 outputs an off signal (on signal in terms of the drive signal) to the switch 26 in the normal state, if the booster circuit 22 outputs the high level signal, a current flows from the booster circuit 22 to the ground via the first resistor part 31, the element part 24, and the second resistor part 32. As shown in FIG. 3, when a current flows from the booster circuit 22 to the ground via the first resistor part 31, the element part 24, and the second resistor part 32, the voltage of the conductive path 82A and the voltage of the source terminal of the switching element 11 become the second threshold Vth or more. In this state, the protection switch 40 (SW3) is kept off. When a current flows in this manner, the voltage between the gate terminal and the source terminal of the first switching element 11 is clamped at a predetermined voltage that is the first threshold or more by the element part 24, and the switching element 11 is kept on. In this manner, when the booster circuit 22 outputs a high level signal in the normal state, the first switching element 11 is kept on, on the condition that the control unit 28 and the switch 26 (switch unit) keep the cancelled state (the switch 26 is off).

Note that, in the above-described normal state, the voltage of the conductive path 82A when a current flows from the booster circuit 22 to the ground via the first resistor part 31, the element part 24, and the second resistor part 32, is greater than the voltage of the conductive path 82B and the output voltage of the second power supply unit 92, for example.

FIG. 4 shows a relationship between the drive signal, the source voltage of the switching element (SW1), the state of the protection switch (SW3), and the state of the switching element (SW1), in the above-described abnormal state. In the case shown in FIG. 4, when the control unit 28 outputs an on signal (off signal in terms of the drive signal) to the switch 26, in other words, when the control unit 28 switches to the short-circuit state (when switch 26 is on), the first switching element 11 (SW1) is kept off.

When the control unit 28 outputs an off signal (on signal in terms of the drive signal) to the switch 26 in the above abnormal state, even if the booster circuit 22 outputs a high level signal, the voltages of the conductive paths 82A and 82B become approximate 0 V due to the ground fault in the load 94 or the like. In other words, the voltage of the conductive path 82A and the source terminal of the switching element 11 are kept at less than the second threshold Vth, and the protection switch 40 (SW3) is kept on. Accordingly, even after the control unit 28 outputs an off signal of the switch 26 (on signal in terms of the drive signal), the protection switch 40 (SW3) is kept on, and the switching element 11 is kept off.

4. Example of Effect

The following describes an example of effect of the first embodiment. The drive device 20 has a function of protecting the circuit that can turn on the switching element 11 by inputting a voltage signal to the gate terminal with which the potential difference between the gate signal (first terminal) and the source terminal (third terminal) of the first switching element 11 is the first threshold or more. When there is an abnormality such as the voltage of the conductive path 82A on the source terminal side of the first switching element 11 becoming less than the second threshold, the drive device 20 may forcibly and immediately turn on the protection switch 40, and forcibly and immediately turn off the first switching element 11. Accordingly, this drive device 20 can realize a simpler configuration in which the first switching element 11 can be immediately switched off when the voltage on one side of the conductive path in which the first switching element 11 is provided decreases significantly.

In the drive device 20, a current flows from the booster circuit 22 (signal output unit) to the ground (reference conductive path) via the first resistor part 31, the element part 24, and the second resistor part 32 on the condition that a high level signal is output from the booster circuit 22 (signal output unit). Due to a decrease in voltage that occurs in the element part 24, the potential difference between the gate terminal and the source terminal of the first switching element 11 becomes the first threshold or more. In this configuration, if a high level signal is output from the booster circuit 22, the first switching element 11 can be appropriately turned on as long as an appropriate current flows through the element part 24. Further, in this drive unit 20, when a high level signal is output from the booster circuit 22, the voltage of the source terminal of the first switching element 11 can be set to a voltage that is high to an extent (a voltage that is the second threshold or more) as long as no abnormality (ground fault, etc.) occurs in the conductive path 82 and the like connected to the source terminal (third terminal) of the first switching element 11. Accordingly, in a state where no abnormality of decreasing in voltage (ground fault, etc.) occurs in the conductive path 82 or the like connected to the source terminal of the first switching element 11, the protection switch 40 can be stably kept off. On the other hand, this drive device 20 can forcibly switch on the protection switch if an abnormality (e.g. a ground fault in the conductive path 82) occurs in which the voltage of the source terminal of the first switching element 11 becomes less than the second threshold, and an excessive current flow into the first switching element 11 can be suppressed.

The drive device 20 can switch the first switching element 11 between on and off by the control unit 28 and the switch 26 (switch unit) in a state where the booster circuit 22 (signal output unit) outputs a high level signal.

The drive device 20 can be applied to a circuit in which the first switching element 11 is interposed between the first power supply unit 91 and the second power supply unit 92. In the normal state, the drive device 20 can keep the protection switch 40 off when a current flows between the first power supply unit 91 and the second power supply unit 92, and in the abnormal state, the drive device 20 can keep the protection switch 40 on when there is conduction between the first power supply unit 91 and the second power supply unit 92. In other words, when there is conduction between the first power supply unit 91 and the second power supply unit 92 and the appropriate voltage based on the output of the power supply unit is applied to the source terminal (third terminal) of the switching element 11, the drive device keeps the protection switch 40 off. In this case, the drive device 20 does not allow the first switching element 11 to perform a forcible off operation based on the protection switch 40. On the other hand, when there is conduction between the first power supply unit 91 and the second power supply unit 92, if no appropriate voltage based on the output of the power supply unit is applied to the third terminal due to a ground fault or the like, the drive device 20 keeps the protection switch 40 on. In this case, the drive device 20 can forcibly and stably turn off the first switching element 11.

The drive device 20 can be applied to a circuit in which the state between the first power supply unit 91 and the second power supply unit 92 is switched between the conductive state and the shut-off (non-conductive) state by the first switching element 11 and the second switching element 12 switched on/off. In this circuit, when both the first switching element 11 and the second switching element 12 are on and in the normal state, the state between the first power supply unit 91 and the second power supply unit 92 enters the conductive state and the voltage of the source terminal (third terminal) becomes the second threshold or more. In other words, when the two switching elements are on and in the normal state, the state between the two power supply units is kept in the conductive state, and a forcible off operation based on the protection switch 40 is not performed on the first switching element 11. On the other hand, when the two switching elements are on and in the abnormal state, since the protection switch 40 can be immediately turned on, the switching element 11 can be immediately and forcibly switched off even if the state between the power supply units 91 and 92 is in the conductive state until just before the switching elements enter the abnormal state.

When no operation is performed to forcibly short-circuit the gate terminal (first terminal) and the source terminal (third terminal) of the first switching element 11, if a high level signal is output from the booster circuit 22 (signal output unit), the drive device 20 allows a current to flow through the element part 24. In this case, a current flows from the booster circuit 22 (signal output unit) to the ground (reference conductive path) via the first resistor part 31, the element part 24 (zener diode), and the second resistor part 32. Then, due to a decrease in voltage that occurs in the element part 24 (zener diode), the potential difference between the gate terminal and the source terminal of the first switching element 11 can be kept at the first threshold or more, making it possible to stably keep the switching element 11 on. In addition, in the normal state, due to a current flowing to the ground via the second resistor part 32, the source terminal of the first switching element 11 is kept at a voltage that is higher than the ground, and likely to be stably kept at the second threshold or more.

OTHER EMBODIMENT

The present disclosure is not limited to the embodiment described according to the above description and the drawings. For example, features of the embodiment described above or below can be combined freely as long as no contradictions arise. Further, any of the features of the embodiment described above or below can be omitted unless specified as essential. Further, the above embodiment may be modified as follows.

In the above embodiment, the drive device 20 does not include the switching elements 11 and 12. However, the drive device 20 may also include the switching elements 11 and 12. In other words, the entire relay device 1 may also correspond to the drive device.

In the above embodiment, the first switching element 11 and the second switching element 12 are constituted by MOSFETs. However, the present invention is not limited to this example. The first switching element and the second switching element may also be N-channel IGBTs (Insulated Gate Bipolar Transistors), for example. In this case, the gate terminal of IGBT constituting the first switching element may correspond to the first terminal, and the collector terminal may correspond to the second terminal, and the emitter terminal may correspond to the third terminal.

Although in the above embodiment, a zener diode is given as an example of the element part 24, the element part 24 may also be constituted by a resistor or another element.

The embodiments disclosed herein are examples in all respects, and should not construed to be restrictive. Note that the scope of the present invention is not limited to the embodiments disclosed herein, and intended to include all modifications that are equivalent to or within the scope of the claims.

The invention claimed is:

1. A drive device for driving a switching element that includes a first terminal, a second terminal, and a third terminal, in a circuit that includes the switching element, and in which the switching element is turned on when a potential difference between the first terminal and the third terminal is a first threshold or more, and the switching element is turned off when the potential difference is less than the first threshold, the drive device comprising:

a protection switch, wherein the protection switch is provided between the first terminal and the third terminal, the protection switch is turned off when a voltage of the third terminal is a second threshold or more, and the protection switch is turned on when the voltage of the third terminal is less than the second threshold, and when the protection switch is turned on, the potential difference between the first terminal and the third terminal is less than the first threshold;

a signal output unit that outputs a high level signal at a predetermined voltage;

a signal line provided between the signal output unit and the first terminal;

a first resistor part provided on the signal line;

a second resistor part that is different from the first resistor part;

an element part provided between the first resistor part and the second resistor part;

wherein one end of the element part is electrically connected, on the signal line, between the first resistor part and the first terminal, another end of the element part is electrically connected to the third terminal, one end of the second resistor part is electrically connected to the third terminal, another end of the second resistor is electrically connected to a reference conductive path, on the condition that the signal output unit outputs a high level signal, a current flows from the signal output unit via the first resistor part and the second resistor part to the reference conductive path, the third terminal has a voltage that is the second threshold or more, and a potential difference between the first terminal and the third terminal due to a decrease in voltage that occurs in the element part; and a switch unit that switches a state between the first terminal and the third terminal between a short-circuit state and a cancelled state where the short-circuit state is cancelled, wherein the switching element turns off when the switching element switches to the short-circuit state in a state where the signal output unit outputs a high level signal, and the switching element turns on, on the condition that when the switching element keeps the cancelled state in a state where the signal output unit outputs a high level signal.

2. The drive device according to claim 1, wherein the switching element is provided between a first conductive path and a second conductive path, the second terminal is electrically connected to the first conductive path, the third terminal is electrically connected to the second conductive path, a first power supply unit is provided on the first conductive path side, a second power supply unit is provided on the second conductive path side, a current flows between the first power supply unit and the second power supply unit on the condition that at least the switching element is on, a state where a voltage of the third terminal is the second threshold or more when there is conduction between the first power supply unit and the second power supply unit is a normal state, and a state where a voltage of the third terminal is less than the second threshold when there is conduction between the first power supply unit and the second power supply unit is an abnormal state.

* * * * *